(12) United States Patent
Meyer

(10) Patent No.: US 7,212,590 B2
(45) Date of Patent: May 1, 2007

(54) TURBOCODER WITH FACILITATED SYNCHRONIZATION

(75) Inventor: Jacques Meyer, Saint Martin le Vinoux (FR)

(73) Assignee: STMicroelectronics S.A., Montrouge (FR)

( * ) Notice: Subject to any disclaimer, the term of this patent is extended or adjusted under 35 U.S.C. 154(b) by 813 days.

(21) Appl. No.: 10/181,186

(22) PCT Filed: Nov. 21, 2001

(86) PCT No.: PCT/FR01/03660

§ 371 (c)(1),
(2), (4) Date: Sep. 24, 2002

(87) PCT Pub. No.: WO02/43251

PCT Pub. Date: May 30, 2002

(65) Prior Publication Data

US 2003/0071720 A1    Apr. 17, 2003

(30) Foreign Application Priority Data

Nov. 22, 2000 (FR) ................... 00 15078

(51) Int. Cl.
*H03D 1/00* (2006.01)
*H04L 27/06* (2006.01)

(52) U.S. Cl. .................... 375/340; 340/310.02

(58) Field of Classification Search ........... 375/340; 340/310.02
See application file for complete search history.

(56) References Cited

U.S. PATENT DOCUMENTS 5,422,894 A    6/1995    Abe et al.
5,710,783 A    1/1998    Luthi et al.
5,742,622 A    4/1998    Claydon et al.
5,793,818 A    8/1998    Claydon et al.
5,937,016 A    8/1999    Choi
5,953,311 A *  9/1999    Davies et al. ............ 370/210
6,065,147 A *  5/2000    Pyndiah et al. ........... 714/755
6,154,871 A    11/2000   Claydon et al.
6,473,878 B1 * 10/2002   Wei ......................... 714/755
6,493,402 B1 * 12/2002   Fimoff ...................... 375/321
6,546,025 B1 *  4/2003   Dupuy ...................... 370/509
6,611,493 B1 *  8/2003   Miyashita et al. .......... 370/208

FOREIGN PATENT DOCUMENTS

WO    WO 00/35101 A1    6/2000

OTHER PUBLICATIONS

International Search Report from application No. PCT/FR 01/03660.

* cited by examiner

*Primary Examiner*—Chieh M. Fan
*Assistant Examiner*—Jia Lu
(74) *Attorney, Agent, or Firm*—Lisa K. Jorgenson; James H. Morris; Wolf, Greenfield & Sacks, P.C.

(57) ABSTRACT

The invention concerns a data transmission device comprising a turbo coder (22) comprising an interleaver operating on two interleaving blocks and means (26) for producing symbols from said codes (D, Y1, Y2) supplied by the turbo coder The device comprises means (28) for inserting a synchronising sequence into said symbols at a site having a predetermined relationship position relative to the symbols produced with the codes associated with a common interleaving block.

12 Claims, 5 Drawing Sheets

TURBOCODER WITH FACILITATED SYNCHRONIZATION

BACKGROUND OF THE INVENTION

1. Field of the Invention

The present invention relates to the transmission of data, and in particular to the transmission of digital data coded by means of a turbocoder.

2. Discussion of the Related Art

A turbocoder includes two (or more than two) simple convolutional type coding circuits and one or several interleavers operating on large data blocks (typically, from 100 to 16,000 bits).

FIG. 1 illustrates a conventional four-state convolutional type coder. Coder 1 receives, at each pulse of a clock, not shown, a bit D. Bit D belongs to a bit sequence corresponding to data to be transmitted, digitized and arranged in series.

Data bit D is directly provided at the output of coder 1 by a first branch $1_1$. Bit D is provided to a coding circuit C by a second branch $1_2$. Circuit C outputs a so-called redundancy bit Y.

Circuit C includes four D-type flip-flops $B_i$ ($B_0$, $B_1$, $B_2$, $B_3$) connected in series and five adders $2_i$ ($2_0$, $2_1$, $2_2$, $2_3$, and $2_4$). Adders $2_i$ are adders modulo 2. At each clock pulse, the state ("0" or "1") at the input of a flip-flop $B_i$ is transferred to its output. Adders $2_i$ are coupled to elements of coder 1 (input, flip-flops $B_i$, other adders, output) so that redundancy bit Y represents a linear combination of four successive data bits.

SUMMARY OF THE INVENTION

Redundancy bit Y is expressed as:

$$Y = \sum_{i=0}^{i=3} bi \cdot D_{n-i}$$

in which bi represents a coefficient depending on the structure of coder C and in which $D_{n-i}$ designates the following data bits: for i=0, the data bit D present at the output at the same time as bit Y and, for i ranging from 1 to 3, the data bits corresponding to the three preceding clock pulses. Σ designates a sum modulo 2.

Coding circuit C includes four flip-flops $B_i$. It is said to be a four-state coding circuit. The total number of possible combinations of the states of flip-flops $B_i$ is equal to $2^4$, that is, 16.

At the output of coder 1, a data bit D associated with a redundancy bit Y, which is a linear combination of several successive bits D, is thus obtained. After transmission, a similar linear combination is calculated on the receive side and redundancy bits Y enable correcting possible errors that have occurred to bits D during transmission.

FIG. 2 illustrates a turbocoder 5, formed by means of two coding circuits $C_1$ and $C_2$, each of which is similar to circuit C of FIG. 1.

Coder 5 receives, as an input, data bits D corresponding to the data to be transmitted. The input of coder 5 drives three parallel $5_1$, $5^2$, and $5_3$. Data bits D are directly provided to the coder output by branch $5_1$. In branch $5_2$, data bits D are provided to coding circuit $C_1$. Circuit $C_1$ provides a first redundancy bit Y1. In branch $5_3$, data bits D are provided to an interleaver 6 in series with a coding circuit $C_2$.

Interleaver 6 operates as follows. First, interleaver 6 stores a predetermined number of bits, corresponding to an interleaving. Then, the interleaver interleaves the bits in a predetermined order, and it outputs the bits of the interleaving block in an order different from the order of arrival. The operations of storage and provision of the interleaved bits are performed in parallel, interleaver 6 storing the bits of an interleaving block while it provides the interleaved bits of the preceding block. The number of bits of an interleaving block is called the interleaving length.

The output of interleaver 6 drives coding circuit $C_2$. Circuit $C_2$ provides a second redundancy bit Y2. The output of coder 5 provides at each clock pulse a code including a data bit D, associated with two redundancy bits Y1 and Y2. Codes D, Y1, and Y2 are sent via a transmission channel (antenna, cable, etc.) after an adequate modulation, generally a QAM (Quadrature Amplitude Modulation) or an MPSK (Multiple Phase Shift Keying) modulation.

Due to the existence of the interleaver, redundancy bits Y2 are formed with bits that can be very distant in time from the data bits provided simultaneously with bits Y2 by coder 5. Coder 5 can be considered as a coder equivalent to a simple convolutional coder having a number of states, that is, a number of flip-flops in series, substantially equivalent to the interleaver length. The decoding of codes obtained by means of coder 5 is relatively simple, its complexity remaining limited to the decoding complexity of the codes obtained by circuits C1 and C2.

FIG. 3 shows a decoder 8 for decoding codes transmitted by coder 5 of FIG. 2.

Decoder 8 receives a signal formed of bits D', Y'1, and Y'2 respectively corresponding to data bits D, and to redundancy bits Y1 and Y2 which have been transmitted. Decoder 8 includes a decoding circuit 10, DEC1. Circuit DEC1 receives, at each clock pulse, a bit D' and a corresponding bit Y'1. Circuit DEC1 has a simple structure, substantially corresponding to the structure of a decoder ensuring the decoding of coded codes by means of circuit C1 only. Circuit DEC1 provides, at each clock pulse, a number linked to the probability of the value of data bit D. At the output of circuit DEC1, an estimation of bits D where some errors are corrected is obtained.

The output of circuit DEC1 is provided to an interleaver 12, of the same structure as interleaver 6 of FIG. 2. Interleaver 12 acts on data blocks of the same length as interleaver 6 and provides bits interleaved in the same way as in interleaver 6. The output of interleaver 12 is provided to a decoding circuit 14, DEC2. Circuit DEC2 also receives the second redundancy bit, Y'2, received at the same time as bit D' present at the input of decoder 8. Circuit DEC2 has substantially the same structure as circuit DEC1 and it provides a more precise estimate of bits D, in which more errors have been corrected.

Circuit DEC2 drives a disinterleaving circuit 16, which puts back in their order of arrival the bits interleaved by interleaver 12. The output of disinterleaver 16 is brought to the input of circuit DEC1 by a connection 18. Connection 18 enables circuit DEC1 to take into account the output of circuit DEC2. Decoder 8 is an iterative decoder. After a few iterations, it is assumed that most errors are corrected and the data are obtained before or after circuit DEC1.

To perform a proper decoding, interleaver 12 must be synchronized with interleaver 6 of the coder. Indeed, the interleaving of interleaver 12 must occur on bits belonging to the same interleaving blocks as interleaver 6. Disinterleaver 16 is synchronized with interleaver 12.

To synchronize interleaver 12 with interleaver 6, it is known to insert a synchronization bit sequence at regular intervals in the bit flow transmitted by the coder. Since the synchronization bits may have become erroneous in the transmission, it is not attempted to immediately determine them after reception before decoding of the rest of the bits, since this could result in poorly synchronizing interleaver 12.

Accordingly, all bits received in decoder 8 are decoded. A hypothesis is made that one of the received bits corresponds to the first position of an interleaving block and the received bits are decoded. A probability of likeliness of the hypothesis is determined. Other tests are performed with the following bits until L+r bits, if the interleaver has a length L and if r is the number of synchronization bits per block, have been considered as being likely to correspond to the first position of an interleaving block. The beginning of the interleaving period is determined by the test that has provided the highest probability. This amounts to L+r tests. Since L is large, the time taken by the decoder to synchronize may become prohibitive.

Another difficulty of the decoding is that, in practice, not all redundancy bits are transmitted.

FIG. 4 illustrates the transmitted bits of a so-called 2/3 coder. Ratio 2/3 is called the transmission ratio. A 2/3 coder is a coder transmitting two data bits for three transmitted bits.

In FIG. 4, four successive data bits $D_i$ ($D_0$ to $D_3$) are illustrated, as well as redundancy bits $Y1_i$ and $Y2_i$ (i ranging from 0 to 3) obtained at the same time as each data bit $D_i$. The surrounded bits are the transmitted bits. The transmitted bits form sequence $D_0$, $D_1$, $Y1_1$, $D_2$, $D_3$, and $Y2_3$. This sequence defines a so-called "puncture" sequence and is repeated every 4 data bits.

The data bits are generally always transmitted. The technique for choosing the redundancy data to be transmitted is called the puncture. The puncture is performed by means of a puncture mask, for example, a table, which eliminates the bits that are not to be transmitted. At the decoding, it is determined which bits are the data bits in the received flow and, among the redundancy bits, which are the bits of type Y1 and those of type Y2. In other words, the puncture phase, that is, the bit corresponding to the beginning of a puncture phase, are recognized. At the decoding, the decoder then synchronizes on the puncture phase. This is done by trying all possible cases, and by choosing the best one.

Further, at the coding, the transmission ratio may be chosen between several possible ratios, for example, 1/2, 2/3, 3/4, 5/6, 5/8, or 8/9. Decoder 8 knows that the transmission ratio used is one of the possible ratios, but it does not know which ratio it is. The decoder of prior art tries all possible cases to find the used transmission ratio. The research to be made is long. For example, with an interleaver acting on blocks of 2,048 bits and three possible redundancy ratios respectively equal to 2/3, 5/6, and 8/9, 180,000 tests of several thousands of bits each must be performed. The tests to be made may become so numerous that the real time processing of the information may become impossible.

Further, if a QAM or MPSK modulation has been used for transmission, the number of tests performed at the decoding must be multiplied by two in QAM and by M in MPSK. Indeed, at the decoding, phase 0 of the carrier is only known to $\pi/2$ in QAM and to $2\pi/M$ in MPSK, and the decoder has to solve this ambiguity by trying all possible cases for the phase.

An object of the present invention is to provide a coder and a turbocoding method enabling easy synchronization of the decoder on the coder interleaver.

Another object of the present invention is to provide a coder and a turbocoding method enabling easy synchronization of the decoder on the coder puncture phase.

To achieve these and other objects, the present invention provides a data transmission device including a turbocoder comprised of an interleaver acting on interleaving blocks, and of a means for elaborating symbols based on codes provided by the turbocoder. The device includes a means for inserting a synchronization sequence in said symbols at a location having a predetermined position relation with respect to the symbols elaborated by means of codes associated with a same interleaving block.

According to an embodiment of the present invention, the device includes a puncture means receiving the codes provided by the turbocoder and providing the symbol elaboration means with a portion only of the codes provided by said coder.

According to an embodiment of the present invention, the puncture means is reset when it receives codes associated with a new interleaving block.

According to an embodiment of the present invention, the symbols are used to modulate in phase and/or in amplitude a carrier at fixed frequency.

The present invention also provides a method for transmitting data, including the steps of:

a) coding the data to be transmitted by a turbocoder including an interleaver acting on interleaving blocks;

b) elaborating symbols based on codes provided by the turbocoder;

c) inserting a synchronization sequence in said symbols at a location having a determined position relation with respect to the symbols elaborated by means of codes associated with a same interleaving block; and d) transmitting the symbols obtained after step c) of synchronization sequence insertion.

According to an embodiment of the present invention, the method includes, between coding step a) and symbol elaboration step b), a puncture step including selecting a portion only of the codes provided by said coder by means of a puncture means.

According to an embodiment of the present invention, the method includes a step of resetting of the puncture means when the puncture means receives codes associated with a new interleaving block.

The present invention also provides a method for decoding data transmitted by an above device or method, including the steps of:

a) for each group of n received symbols, n corresponding to the number of symbols in a synchronization sequence, calculating an amount representative of the probability of the presence of a synchronization sequence;

b) if said amount exceeds a determined threshold, incrementing a counter/downcounter initially set to zero;

c) after a duration corresponding to a possible period of the synchronization sequence, calculating again an amount representative of the probability of the presence of a synchronization sequence and incrementing the counter/downcounter if a synchronization sequence is detected again; otherwise, decrementing the counter/downcounter;

d) when the counter/downcounter reaches its maximum, declaring that the synchronized state has been reached; and e) if the counter/downcounter reaches its minimum, resetting the counter/downcounter and waiting for another synchronization detection.

According to an embodiment of the present invention, after a determined duration without reaching the synchronized state, the step of trying another possible period of the synchronization sequence is carried out.

According to an embodiment of the present invention, when the synchronized state has been reached, the step of decoding the symbols is carried out.

The foregoing and other objects, features and advantages of the present invention will be discussed in detail in the following non-limiting description of specific embodiments in connection with the accompanying drawings, in which:

DETAILED DESCRIPTION

Figure 1:
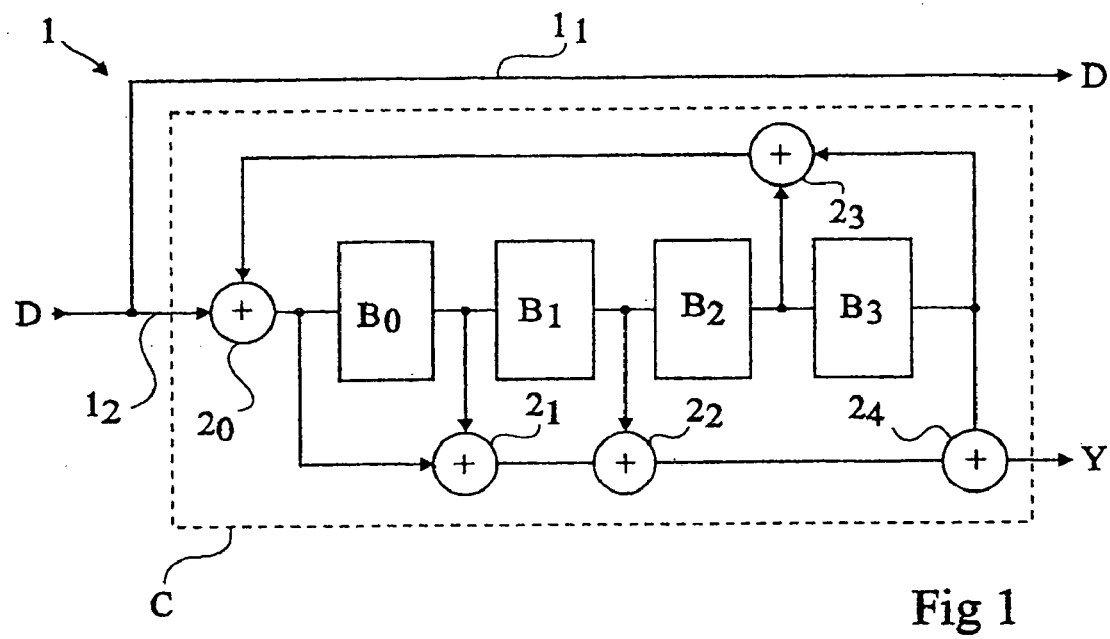
FIG. 1 illustrates a conventional coder of convolutional type.
Figure 2:
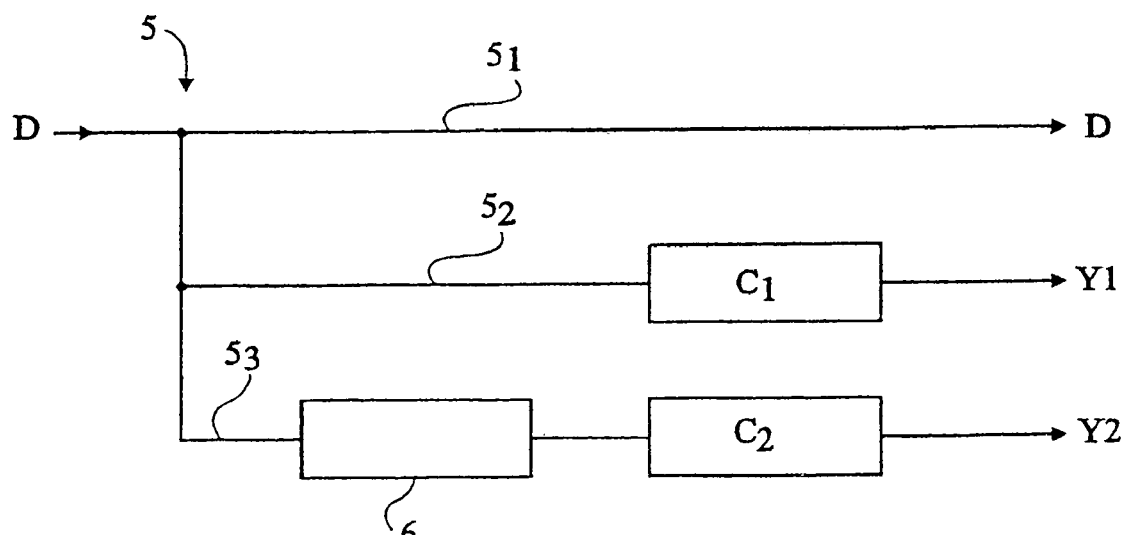
FIG. 2 illustrates a conventional turbocoder.
Figure 3:
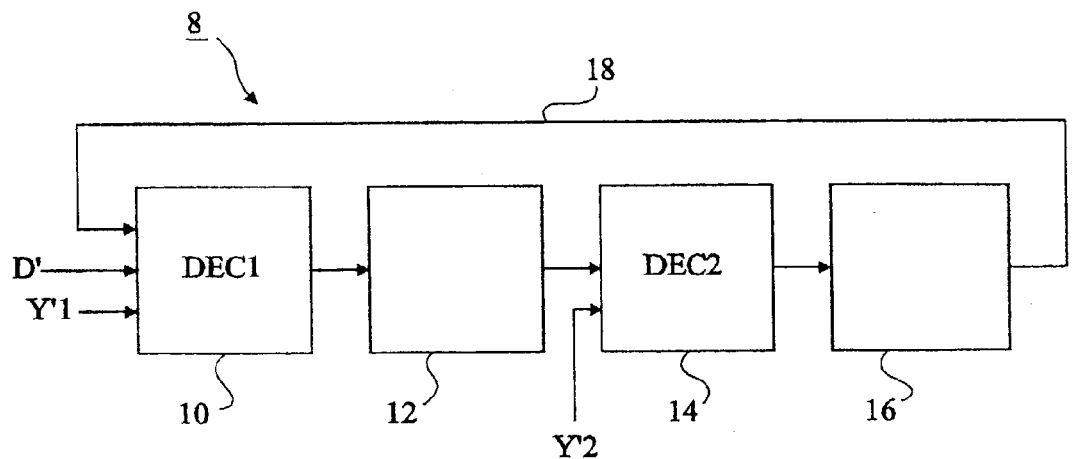
FIG. 3 illustrates a conventional decoder corresponding to the coder of FIG. 2.
Figure 4:
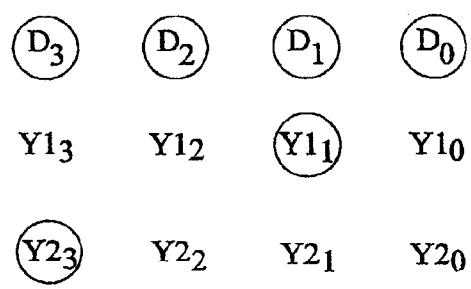
FIG. 4 illustrates a puncture sequence with a 2/3 transmission ratio.
Figure 5:
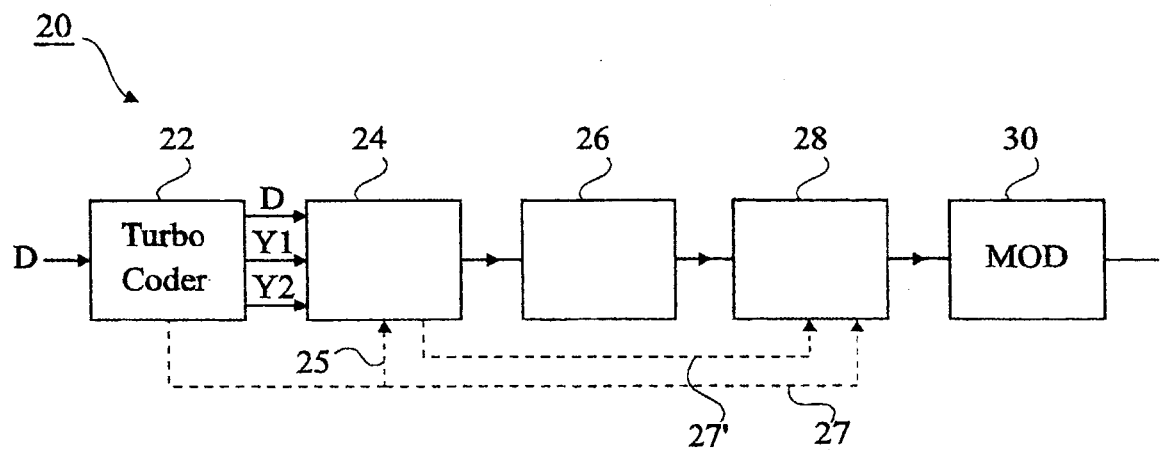
FIG. 5 shows a coder according to the present invention.

In FIG. 5, data bits D, corresponding to the data to be transmitted, are provided as a sequence to the input of a coder 20. Coder 20 includes a turbocoder 22. Circuit 22 provides, at each pulse of a clock not shown, a data bit D, a first redundancy bit Y1 and a second redundancy bit Y2. Circuit 22 may be identical to coder 5 of FIG. 2 or to a turbocoder of any known type providing data bits, and two or more redundancy bits.

Bits D, Y1, and Y2 drive a puncture circuit 24. Circuit 24 determines, according to the desired transmission ratio, the redundancy data to be kept for transmission. For this purpose, circuit 24 uses a puncture mask. A puncture sequence can be defined by the number of data bits provided at once by the puncture mask. Circuit 24 is adapted to various transmission ratios and, accordingly, the puncture sequences may include different numbers of bits.

Circuit 24 of the present invention is reset at the beginning of each interleaving block. For example, when the first bit Y2 of a new interleaving block is provided by circuit 22 to circuit 24, circuit 24 is made to start a puncture sequence. This resetting is symbolized by dotted lines 25, connecting circuit 22 to circuit 24.

The output of circuit 24 provides a bit sequence, including data bits D and the retained redundancy bits Y1 and Y2. The output of circuit 24 drives a symbol elaboration circuit 26. Circuit 26 uses the bits provided thereto to form symbols that it outputs. A symbol is an analog information, for example, a complex number, corresponding to a predetermined number of successive bits of the bit sequence provided by circuit 24. The symbols can represent a phase information in a modulation of MPSK type or a phase and amplitude information in a modulation of QAM type.

Figure 6:
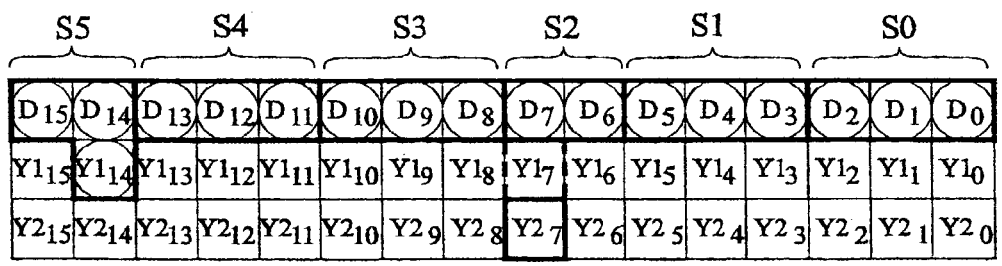
FIG. 6 shows a puncture sequence with a 8/9 transmission ratio.

FIG. 6 illustrates the case where the formed symbols correspond to three consecutive bits and where the transmission ratio is 8/9.

In FIG. 6, 16 bits $D_i$ ($D_0$ to $D_{15}$) form the data bits corresponding to a puncture sequence. Under each bit $D_i$ are shown redundancy bits $Y1_i$ and $Y2_i$ provided by coding circuit 22. Since there are eight data bits for nine transmitted bits, and that there further are two different types of redundancy bits to be transmitted (Y1 and Y2), the puncture sequence includes 16 data bits. The selected redundancy bits are bit $Y2_7$ after bit $D_7$ and bit $Y1_{14}$ after bit $D_{14}$. Circuit 26 will provide, for each puncture sequence, a first symbol S0 corresponding to data bits $D_0$ to $D_2$. The next symbols, S1 to S5, respectively correspond to $D_3$ to $D_5$; $D_6$, $D_7$, $Y2_7$; $D_8$ to $D_{10}$; $D_{11}$ to $D_{13}$; $D_{14}$, $Y1_{14}$, $D_{15}$. In FIG. 6, the bits to be transmitted are surrounded with a circle and the bits used to form a symbol are surrounded with a black frame.

The number of bits used to form a symbol is a function of the desired transmission mode. For example, symbols formed of three bits are particularly well adapted to an 8 PSK modulation, illustrated in FIG. 7.

Figure 7:
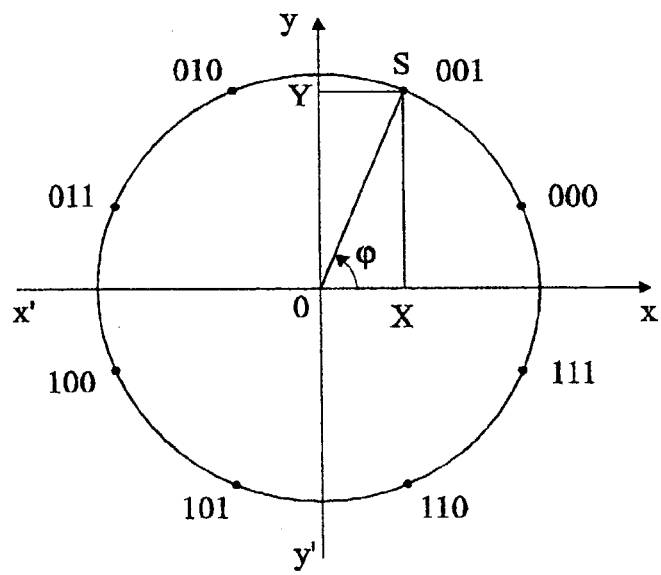
FIG. 7 illustrates an 8PSK modulation.

FIG. 7 illustrates a constellation of eight symbols in a complex plane x'0x, y'0y. A specific phase of the carrier is associated with each symbol, for transmission. Half-line Ox corresponds to phase 0 of the carrier. A symbol S may be represented sented by a complex number X+Yj, or by its phase φ with respect to half-line Ox. The phase of the modulated carrier is, for the symbol S shown (001), φ=3π/8. In a QAM modulation (not shown), the carrier is modulated in phase and amplitude; each symbol can then be associated with a complex number of specific module.

In FIG. 5, the symbols elaborated by circuit 26 are provided to a circuit 28 of insertion of synchronization symbols. Circuit 28 inserts a synchronization sequence in the train of symbols provided by circuit 26. The synchronization sequence may include any number of symbols, four, for example, or even a single symbol. The symbols of the synchronization sequence are symbols that can further appear in the train of symbols originating from circuit 26.

The insertion of symbols of the synchronization sequence is performed at a predetermined location in the train of symbols originating from circuit 26. This location is chosen as follows. Among bits D, $Y_1$, $Y_2$ provided by circuit 22, the bits associated with a same interleaving block are first considered. These bits correspond to the data bits D of an interleaving block and to the redundancy bits $Y_1$, $Y_2$ provided by circuit 22 at the same time as bits D of the considered interleaving block. Then, the symbols elaborated by means of these bits associated with a same interleaving block are considered, and the symbols of the synchronization sequence are inserted at a predetermined location among these symbols, for example after the third symbol of the symbol set thus defined. This operation is repeated for each of the following interleaving blocks.

The predetermined location of insertion of the synchronization sequence is any location among the symbols built up by means of bits associated with a same interleaving block. Thus, the synchronization sequence can be inserted between symbols built up from bits associated with different interleaving blocks. In this case, the locating of the synchronization sequence upon reception directly provides an indication of the beginning of the interleaving blocks. Connections in dotted lines 27, 27' respectively connecting circuits 22 and 24 to circuit 28 symbolize the relations enabling insertion of the synchronization sequence at the predetermined location. Further, if circuit 26 is adaptable, for example, to several types of modulations and can build up symbols corresponding to different numbers of bits, circuit 28 can receive from circuit 26 an information indicating the number of bits used to form a symbol.

It should be noted that, in the coder according to the present invention, the synchronization symbols do not always occupy the same time position in the transmitted train of symbols, the synchronization symbols not always being separated by a same number of symbols. Indeed, the number of symbols separating two successive synchronization sequences at least depends on the used transmission ratio, unknown of the decoder. Thus, in a given transmission, the synchronization sequence has a specific period, that is, it intervenes at regular intervals, but this period belongs to a set of possible periods and is unknown by the decoder, which only knows the set of possible periods.

The output of circuit 28 drives a modulator circuit 30, via possible filters not shown, such as smoothing filters, intended for suppressing possible undesirable frequencies. The modulation performed by modulator 30 for example is a modulation of QAM or MPSK type, M being equal to 4, 8, 16 or 32. If modulator 30 for example is of 16 QAM or 16 PSK type, the symbols will correspond to four bits. If it is an 8 PSK modulator, the symbols will be symbols corresponding to three bits, as seen in relation with FIG. 7. The output of modulator 30 drives a transmission channel, which may, for example, be a cable or a hertzian link.

Figure 8:
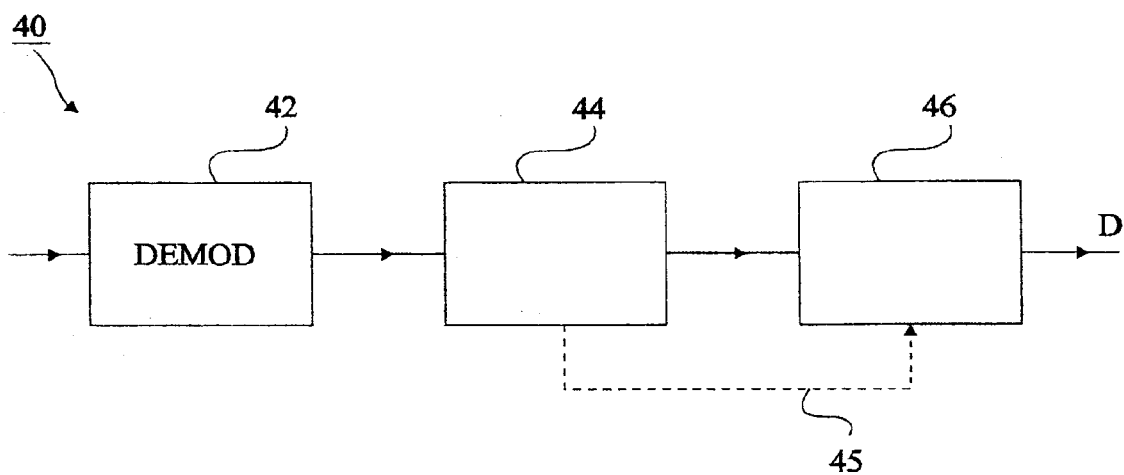
FIG. 8 shows a decoder according to the present invention.

FIG. 8 illustrates a decoder 40 according to the present invention. The signals received by decoder 40 correspond to the signals transmitted by coder 20 and may include errors.

The received signals drive a demodulator 42 ("DEMOD") in which they are demodulated to provide a symbol sequence. The symbols provided by demodulator 42 are provided to a synchronization symbol detection circuit 44.

Circuit 44 has the function of determining the synchronization symbols from among the symbols that are provided thereto. Circuit 44 operates as follows.

If the synchronization sequence includes n symbols (n is unknown by the decoder), for each group of n received symbols, an amount representative of the probability of the presence of the synchronization sequence is calculated. For example, the sum of the squares of the distances between the received symbols and the synchronization symbols may be calculated. The sum of the absolute values of these distances may also be calculated.

If the calculated amount exceeds a given determined threshold, it is assumed to be in the presence of the synchronization sequence and a counter/downcounter not shown, present in circuit 44, is incremented. The output of the counter/downcounter may vary between a negative or null minimum value and a positive maximum value. The counter/downcounter is initially set to zero. After a possible period of the synchronization sequence, if a synchronization is detected again, the counter/downcounter is incremented. Otherwise, it is decremented.

When the output of the counter/downcounter reaches its maximum value, the synchronized state is considered to have been reached. The synchronization symbols are then removed and the remaining symbols (corresponding to the data and redundancy bits) are provided to a decoding circuit 46.

If the output of the counter/downcounter reaches its minimum value, the counter/downcounter is reset and another synchronization detection is awaited. After a given time without reaching the synchronized state, another possible period for the synchronization sequence is tried. If, after all possibilities have been tried, there still has not been any synchronization, it is deduced that there are no transmitted data in the received signals. Generally, however, data are transmitted and decoding circuit 46 receives a sequence of symbols to be decoded.

It should be noted that decoder 40 solves the ambiguity existing on phase 0 of the carrier by trying all possible cases for the phase (eight in 8PSK modulation). Since the total number of tests to be made is very reduced in the present invention as compared to prior art, the tests for raising the phase ambiguity may easily be performed in parallel, to more rapidly reach the synchronized state.

Circuit 46 first transforms the symbols that it receives into a bit sequence. In this bit sequence, the bit corresponding to the beginning of an interleaving block is known, due to the predetermined position relation between the synchronization symbols and those coming from a same interleaving block. Circuit 44 transmits to circuit 46 an information about the position of the bit corresponding to the beginning of each interleaving block, which is symbolized on the drawing by dotted lines 45.

Since the bits associated with an interleaving block are perfectly well known, and since, further, the puncture sequence has been reset at the beginning of the interleaving block, circuit 46 easily decodes the provided symbols. Circuit 46 provides, at the output of decoder 40, data bits D with few errors.

Decoder 40 has several advantages.

Indeed, in the present invention, it is not necessary to wait for the complete decoding of the data to determine the synchronization. Since decoder 46 is not in the synchronization search loop, the tests to be made are much fewer and take less time. In the present invention, it is not necessary to search the beginning of puncture sequences, since they are linked to the interleaving blocks. Thus, the synchronization can occur in conditions where the turbocoder has no gain, that is, where it generates more errors than it corrects.

In a practical example, the interleaver acts upon 2,048-bit blocks; transmission ratio R is one of ratios R=2/3, 5/6 or 8/9; the synchronization sequence includes four synchronization symbols. Then, the number of bits separating two synchronization sequences is 2048/(3×R), for an 8 PSK modulation where the symbols correspond to three bits. In this case, the decoder of the present invention synchronizes in less than 10 milliseconds for a data rate equal to 20 megabauds while, for an equal data rate, several seconds, that is, a duration several hundreds of times greater, are necessary for the prior art decoder to synchronize.

Of course, the present invention is likely to have various alterations, modifications, and improvements which will readily occur to those skilled in the art. In particular, when coding circuit 22 is a coder of a type providing more than two redundancy bits for each data bit, circuit 24 will be easily adapted by those skilled in the art to provide symbols by means of the bits provided thereto.

Also, circuit 24 and 26 of synchronization symbol elaboration and insertion may be made in the form of a single circuit implementing the two functions. Also, circuit 46 may be divided up in several circuits, each implementing a different function of circuit 46.

Also, in the foregoing, a synchronization sequence is introduced between the symbols corresponding to the bits of a same interleaving block. Of course, the synchronization sequence may be introduced after any predetermined number of symbols corresponding to the bits of a same interleaving block, this predetermined number being known by the decoder. Also, several synchronization sequences may be introduced between the symbols corresponding to the bits of a same interleaving block. Also, two successive synchronization sequences may be separated by a number of symbols corresponding to the bits of two interleaving blocks or more.

Figure 9:
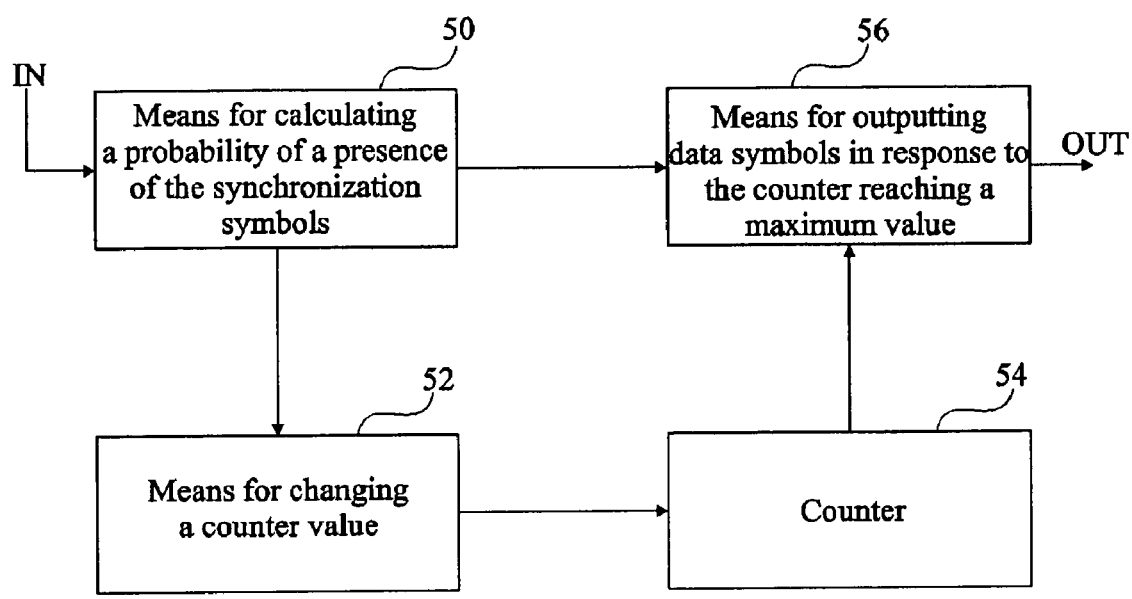
FIG. 9 shows a circuit according to the present invention.

FIG. 9 shows a device comprising an input IN coupled to unit 50 comprising means for calculating a probability of presence of the synchronization symbols. Unit 50 is coupled to unit 52, which comprises means for changing a counter value depending on the probability of a presence of the synchronization symbols. Unit 52 is coupled to counter 54. Counter 54 is coupled to unit 56. Unit 56 is coupled to unit 50 and comprises means for outputting data symbols in response to the counter reaching a maximum value. The device comprises an output OUT coupled to Unit 56.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for transmitting data, including the steps of:
    a) coding the data to be transmitted by a turbocoder including an interleaver acting on interleaving blocks;
    b) elaborating symbols based on codes provided by the turbocoder;
    c) inserting, between an adjacent two of said symbols, at least one synchronization sequence comprising at least one synchronization symbol, at a location having a predetermined position relation with respect to a set of symbols, the set of symbols being elaborated by means of codes that are associated with one of the interleaving blocks;
    d) transmitting the symbols obtained after step c) of synchronization sequence insertion;
    e) for each group of n received symbols, n corresponding to the number of symbols in a synchronization sequence, calculating an amount representative of the probability of the presence of a synchronization sequence;
    f) if said amount exceeds a determined threshold, incrementing a counter/downcounter initially set to zero;
    g) after a duration corresponding to a possible period of the synchronization sequence, calculating again an amount representative of the probability of the presence of a synchronization sequence and incrementing the counter/downcounter if a synchronization sequence is detected again; otherwise, decrementing the counter/downcounter;
    h) when the counter/downcounter reaches its maximum, declaring that a synchronized state has been reached; and
    i) if the counter/downcounter reaches its minimum, resetting the counter/downcounter and waiting for another synchronization detection.

2. The method of claim 1, including, between coding step a) and symbol elaboration step b), a puncture step including selecting a portion only of the codes provided by said coder by means of a puncture means.

3. The method of claim 2, including a step of resetting of the puncture means when the puncture means receives codes associated with a new interleaving block.

4. The method of claim 1, wherein, after a determined duration without reaching the synchronized state, a step of trying another possible period of the synchronization sequence is carried out.

5. The method of claim 4, wherein, when the synchronized state has been reached, the step of decoding the symbols is carried out.

6. A system for decoding data, comprising:
    a demodulation circuit to demodulate a received signal comprising data symbols and synchronization symbols located at a predetermined location relative to the data symbols, and to output the demodulated signal;
    a synchronization symbol detection circuit to receive the demodulated signal, identify the synchronization symbols, and output the data symbols:
    a decoding circuit to receive and decode the data symbols;
    wherein the synchronization symbol detection circuit is configured with knowledge of the location of the synchronization symbols with respect to the data symbols prior to the reception of the synchronization symbols
    means for calculating a probability of a presence of the synchronization symbols in the demodulated signal; and
    means for changing a value of a counter by an amount dependant on the calculated probability, and outputting the data symbols to the decoding circuit in response to the counter reaching a maximum value.

7. The system of claim 6, further comprising means for removing the synchronization symbols from the demodulated signal prior to outputting the data symbols.

8. A method of decoding a data stream comprising data bits and synchronization bits, the method comprising:
    determining which bits of the data stream are the data bits by determining locations of the synchronization bits in the data stream;
    subsequently decoding the data bits in the data stream;
    calculating a probability of a presence of the synchronization bits in the data stream; and
    changing a value of a counter by an amount dependent on the calculated probability,
    wherein the step of decoding includes decoding the data bits in response to the counter reaching a maximum value.

9. The method of claim 8, further comprising: removing the synchronization bits from the data stream prior to decoding the data bits.

10. A method for transmitting data, including the steps of:
    a) coding the data to be transmitted by a turbocoder including an interleaver acting on interleaving blocks;
    b) elaborating symbols based on codes provided by the turbocoder;
    c) inserting a synchronization sequence in said symbols at a location having a determined position relation with respect to the symbols elaborated by means of codes associated with a same interleaving block; and
    d) transmitting the symbols obtained after step c) of synchronization sequence insertion.
    e) for each group of n received symbols, n corresponding to the number of symbols in a synchronization sequence, calculating an amount representative of the probability of the presence of a synchronization sequence;
    f) if said amount exceeds a determined threshold, incrementing a counter/downcounter initially set to zero;
    g) after a duration corresponding to a possible period of the synchronization sequence, calculating again an amount representative of the probability of the presence of a synchronization sequence and incrementing the counter/downcounter if a synchronization sequence is detected again; otherwise, decrementing the counter/downcounter;

h) when the counter/downcounter reaches its maximum, declaring that a synchronized state has been reached; and i) if the counter/downcounter reaches its minimum, resetting the counter/downcounter and waiting for another synchronization detection.

11. The method of claim 10, wherein, after a determined duration without reaching the synchronized state, a step of trying another possible period of the synchronization sequence is carried out.

12. The method of claim 11, wherein, when the synchronized state has been reached, the step of decoding the symbols is carried out.

* * * * *

UNITED STATES PATENT AND TRADEMARK OFFICE
CERTIFICATE OF CORRECTION

| | | |
|---|---|---|
| PATENT NO. | : 7,212,590 B2 | Page 1 of 1 |
| APPLICATION NO. | : 10/181186 | |
| DATED | : May 1, 2007 | |
| INVENTOR(S) | : Jacques Meyer | |

It is certified that error appears in the above-identified patent and that said Letters Patent is hereby corrected as shown below:

Col. 1, line 63 should read:
--three parallel branches $5_1$, $5_2$, and $5_3$. Data bits D are directly provided--

Signed and Sealed this

Twenty-sixth Day of June, 2007

JON W. DUDAS
*Director of the United States Patent and Trademark Office*